US006565826B2

(12) United States Patent
Jacobsen et al.

(10) Patent No.: US 6,565,826 B2
(45) Date of Patent: *May 20, 2003

(54) METHOD OF PREPARING ZEOLITE SINGLE CRYSTALS

(75) Inventors: Claus J. H. Jacobsen, Jaegerspris (DK); Jindrich Houzvicka, Holte (DK); Iver Schmidt, Copenhagen (DK); Claus Madsen, Copenhagen (DK); Anna Carlsson, Virum (DK)

(73) Assignee: Haldor Topsoe A/S, Lyngby (DK)

( * ) Notice: Subject to any disclaimer, the term of this patent is extended or adjusted under 35 U.S.C. 154(b) by 23 days.

This patent is subject to a terminal disclaimer.

(21) Appl. No.: 09/730,462

(22) Filed: Dec. 5, 2000

(65) Prior Publication Data

US 2001/0003117 A1 Jun. 7, 2001

(30) Foreign Application Priority Data

Dec. 6, 1999 (DK) .......................................... 1999 01745

(51) Int. Cl.⁷ .......................... C01B 39/04; C01B 39/36
(52) U.S. Cl. ........................ 423/716; 423/705; 423/707; 423/DIG. 22; 423/DIG. 27; 423/713; 502/63; 502/64
(58) Field of Search ................................. 423/700, 705, 423/707, 716, DIG. 22, DIG. 27, 713, 326; 502/60, 63, 64

(56) References Cited

U.S. PATENT DOCUMENTS 4,508,842 A 4/1985 Onuma et al.

6,241,960 B1 * 6/2001 Topsoe et al. .............. 423/700

FOREIGN PATENT DOCUMENTS

| EP | 695 215 B | * 10/1997 |
| EP | 1002764 A1 | 5/2000 |
| WO | WO 95/29751 A | * 11/1995 |
| WO | WO-97/47381 A | * 12/1997 |
| WO | WO-00/00287 A | * 1/2000 |

OTHER PUBLICATIONS

C.J.H. Jacobsen et al., "Mesoporous Zeolite Single Crystals," *J. Am. Chem. Soc.*, vol. 122, 2000, pp. 7116–7117.

B.T. Holland et al., "Dual Templating of Macroporous Silicates with Zeolite Microporous Frameworks," *J. Am. Chem. Soc.*, vol. 121, 1999, pp. 4308–4309.

Claus Madsen, et al. "Nanosized Zeolite Crystals—Convenient Control of Crystal Size Distribution by Confined Space Synthesis", *Chem. Commun.* 1999, pp. 673–674.

J.S. Beck, et al. "A New Family of Mesoporous Molecular Sieves Prepared With Liquid Crystal Templates", Journal of the American Chemical Society, vol. 114, Dec. 30, 1992; pp. 10834–10843.

* cited by examiner

*Primary Examiner*—David Sample
(74) *Attorney, Agent, or Firm*—Dickstein Shapiro Morin & Oshinsky, LLP

(57) ABSTRACT

Method of preparing zeolite single crystals comprising the step of: applying a synthesis gel with zeolite precursor composition within pore system and on surface of a particulate matrix material having a predetermined pore structure and particle size; subjecting the precursor composition to crystallising conditions; and isolating porous single crystals of the zeolite by removing the matrix material.

4 Claims, 1 Drawing Sheet

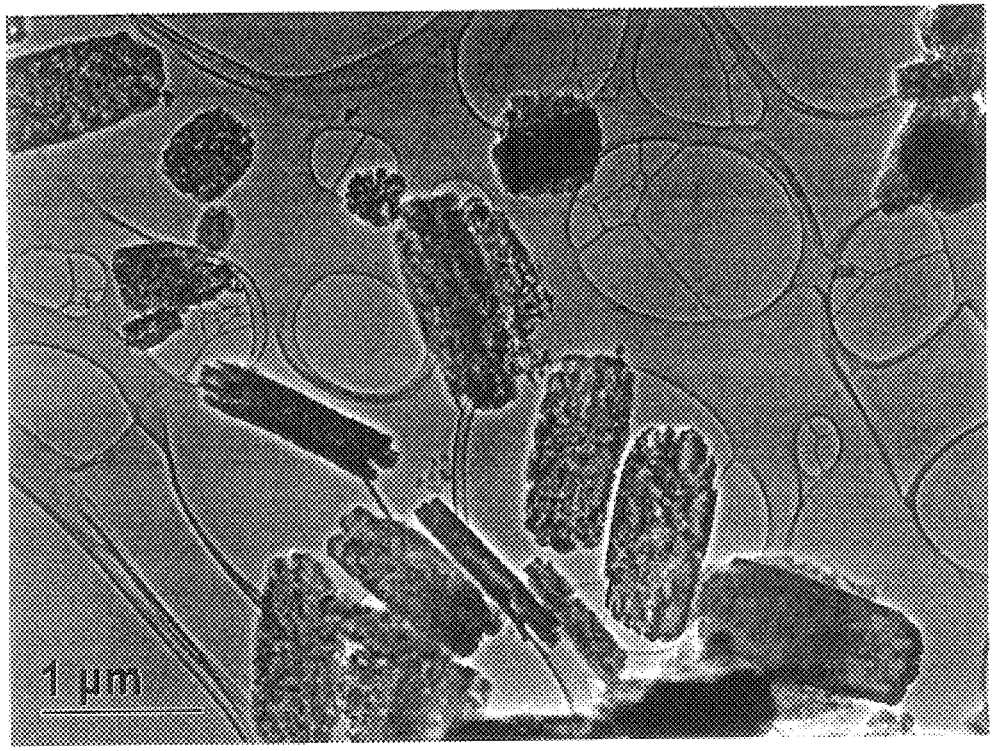

METHOD OF PREPARING ZEOLITE SINGLE CRYSTALS

The present invention relates to a method of preparing zeolite crystals with a determined pore system.

Zeolites find widespread use as heterogeneous catalysts. In many applications it is a problem that zeolites only have micropores, since this imposes diffusion limitations on the reaction rate. Several attempts to provide zeolitic crystals with a mesoporous system have been made in the past. One possibility is to lower the crystal size of the zeolite, the void in between the individual crystals forming the mesopores (intercrystalline pores), (Madsen C. Jacobsen, C. J. H., Chem.Comm. (1999) 673) and another possibility is to use mesoporous MCM-41 type materials (e.g. Beck, J. S. et al. J.Am.Chem.Soc. 114 (1992) 10832), although they only exhibit a strict two-dimensional order and consequently do not posses the same acidity as zeolites with three-dimensional order.

This invention provides a method for preparing zeolite crystals with a tuneable pore system of zeolite crystals. The method involves crystallisation of the zeolite within and on surface of a matrix consisting of particles of which a majority is in the size range of 10–500 nm. In this way it is possible for the zeolite to grow into large single crystals encapsulating part of the matrix particles. The matrix is impregnated both inside and on the surface of the matrix, if the amount of impregnation solution (zeolite gel) applied is higher than the pore volume characteristic of the matrix (excess of gel compared to incipient wetness).

When using e.g. carbon as the matrix, the zeolite crystals can be isolated by removal of the carbon either by a controlled combustion or by hydrogenation. Other matrices can be used and removed e.g. by selective dissolution or by hydrolysis etc. The matrix is preferably inert and stable under zeolite synthesis conditions and exhibits appropriate pore morphology. By removing the matrix from the large single crystals, mesopores are created inside the individual large crystals, i.e. intracrystalline mesopores.

Large zeolite crystals with intracrystalline mesopores are easily separated from the synthesis medium by means of filtration, whereas micro zeolite crystals (being able to create intercrystalline mesopores) require ultracentrifugation in order to be separated from the synthesis medium. Another advantage of large single zeolite crystals is that the hydrothermal stability of the zeolite is increased.

It is preferred to remove the matrix to an extent, which does not hinder transport of reactants and products in the mesopores. However, complete removal of the matrix is not required. Preferably, the remaining amount of matrix material inside the zeolite crystals is as low as possible.

EXAMPLE 1

In a specific embodiment of the invention, 15 g of carbon Black Pearls 2000 (supplied by Carbot Corp.) was impregnated to around 30% excess compared to incipient wetness with a clear solution of tetrapropylammonium hydroxide, sodium hydroxide, sodium aluminate (corresponding to ca. 50% zeolite), water and ethanol. After evaporation of ethanol, the carbon particles are impregnated with 18.3 g tetraethylorthosilicate (TEOS), which correspond to 30% excess of the evaporated ethanol volume. The composition of the synthesis gel was 1 $Al_2O_3$: 20 $TPA_2O$: 1 $Na_2O$: 100 $SiO_2$: 200 $H_2O$: 200 EtOH. After ageing for 3 hours at room-temperature, the impregnated carbon black was introduced into a stainless steel autoclave containing enough water to produce saturated steam and heated to 180° C. for 72 hours. After cooling the autoclave to room-temperature, the product was suspended in water, filtered by suction, re-suspended in water and filtered again. This procedure was repeated four times. Finally, the product was dried at 110° C. for 10 hours. The carbon black matrix was removed by combustion in a muffle furnace at 550° C. for 8 hours.

Transmission electron micrography (TEM) of a sample of the resulting zeolite crystals are shown in the Figure. The Figure shows large grown zeolite crystals. In the TEM the zeolite crystals are recognisable as dark elements with white 'dots' upon them. The dots are mesopores created by removal of the matrix. The background pattern between the dark zeolite elements is the TEM presentation of the carbon grid supporting the sample of zeolite crystals.

The individual crystals formed in Example 1 were typically of the size 1×0.5×0.5 $\mu m^3$. The mesopore diameters obtained were equal to the diameters of the primary particle size of the matrix (20 nm).

EXAMPLE 2

Synthesis of mesoporous silicalite-1.

In a specific embodiment of the invention carbon black (2.50 g BP2000) was impregnated to incipient wetness with a clear solution consisting of tetrapropylammonium hydroxide, water and ethanol. After evaporation of ethanol, the carbon particles were impregnated with tetraethylorthosilicate (TEOS). The volume of the alcoxide solution corresponds to 20% excess of the ethanol volume. The composition of the synthesis gel was 25 $TPA_2O$: 100 $SiO_2$: 1150 $H_2O$. After ageing for more than 3 hours at room temperature the impregnated carbon black was introduced into a stainless steel autoclave containing sufficient amount of water to produce saturated steam at the crystallisation temperature. The autoclave was heated slowly (0.5° C./min) to 180° C. and kept at this temperature for 24 hours. After cooling the autoclave to room temperature the product was suspended in water, filtered by suction, resuspended in water and filtered again. This was repeated four times and then the product was dried at 110° C. for 10 hours.

The carbon black matrix was removed by combustion as in Example 1.

The individual crystals formed in Example 2 were typically of the size 2×1×1 $\mu m^3$. The mesopore diameters obtained were equal to the diameters of the primary particle size of the matrix (20 nm).

EXAMPLE 3

Synthesis of mesoporous titanium silicalite.

In a specific embodiment of the invention 10.0 g of BP700 was impregnated to incipient wetness with a clear solution consisting of 11.0 g tetrapropylammonium hydroxide, 2.5 g water and 7.0 g ethanol. After evaporation of ethanol, the carbon particles were impregnated with a premixed solution of 10.0 g tetraethylorthosilicate (TEOS) and 0.1 g of tetraethylorthotitanate (TEOT), which had been depolymerising the TEOT by stirring for 10 minutes. The volume of the alcoxide solution corresponds to 20% excess of the ethanol volume. After ageing for more than 3 hours at room temperature the impregnated carbon black was introduced into a stainless steel autoclave containing a sufficient amount of water to produce saturated steam at crystallisation temperature. The autoclave was heated slowly (0.5° C./min) to 180° C. and kept at this temperature for 72 hours. After cooling the autoclave to room temperature the product was suspended in water, filtered by suction, resuspended in water and filtered again. This was repeated four times. The product was then dried at 110° C. for 10 hours. The carbon black matrix was removed by combustion as in Example 1.

The individual crystals formed in Example 3 were typically of the size 1×0.5×0.5 μm³. The mesopore diameters obtained were equal to the diameters of the primary particle size of the matrix (15 nm).

EXAMPLE 4

Example 3 was repeated with the exception that carbon support was changed from the BP700 type to the BP2000 type.

The difference in the mesopore volume of the two carbons (1.4 cm³/g for BP700 and 4.0 cm³/g for BP2000), however, required using different amounts of carbon for similar amounts of gel. Thus, only 4.0 g of BP2000 were used in Example 4.

The individual crystals formed in Example 4 were typically of the size 2×1×1 μm³. The mesopore diameters obtained were equal to the diameters of the primary particle size of the matrix (20 nm).

EXAMPLE 5

In a specific embodiment mesoporous zeolite beta was synthesised from a gel with the molar composition $4Na_2O$: $20(TEA)_2O$: $80SiO_2$: $Al_2O_3$: $800H_2O$. The appropriate amount of carbon black, 10.0 g BP2000, was impregnated to incipient wetness with a clear solution consisting of 23.0 g 30% tetraethylammonium hydroxide solution, 0.9 g water, 0.27 g NaOH, 0.22 g NaAlO2, and 13.5 g ethanol. After evaporation of ethanol, the carbon particles were impregnated with 18.3 g tetraethylorthosilicate (TEOS), which corresponds to 20% excess of the evaporated ethanol volume. After ageing for more than 3 hours at room temperature the impregnated carbon black was introduced into a stainless steel autoclave containing a sufficient amount of water to produce saturated steam at the crystallisation temperature. The autoclave was heated slowly (0.5° C./min) to 140° C. and kept at this temperature for 96 hours. After cooling the autoclave to room temperature the product was suspended in water, filtered by suction, resuspended in water and filtered again. This was repeated four times and then the product was dried at 110° C. for 10 hours. The carbon black matrix was removed by combustion as in Example 1.

The individual crystals formed in Example 5 were typically of the size 2×1×1 μm³. The mesopore diameters obtained were equal to the diameters of the primary particle size of the matrix (20 nm).

Selected area electron diffraction analysis confirmed that the particles obtained in Examples 1–5 were single crystals.

The resulting mesoporous zeolite single crystals contain footprints from the carbon matrix. Obviously, the carbon matrix dictates the mesopore system and the pore size can be tuned by proper choice of the carbon. Carbon fibers can also be use for producing a pore system of straight channels. The mesoporosity of the zeolite crystals can be controlled by adjusting the amount of zeolite gel relative to the amount of the carbon matrix.

The inventive method is generally applicable in preparation of mesoporous zeolite single crystals and in the preparation of crystalline material, where the material crystallises within and around the pore system of a removable matrix. Combustion, hydrogenation, selective dissolution and/or evaporation may remove the matrix.

BRIEF DESCRIPTION OF THE DRAWING

The FIGURE is a transmission electron micrograph of the zeolite crystals of Example 1.

What is claimed is:

1. Method of preparing zeolite single crystals comprising the steps of:
    applying a synthesis gel with a zeolite precursor composition within a pore system and on a surface of a particulate matrix material having a pore structure and particle size;
    subjecting the precursor composition to crystallizing conditions; and
    isolating porous single crystals of the zeolite by removing the matrix material.

2. The method of claim 1, wherein the matrix material is inert and chemical stable under zeolite crystallising conditions.

3. The method of claim 1, wherein the matrix material consists of carbon particles.

4. The method of claim 1, wherein the matrix material is removed from the zeolite crystals by combustion, hydrogenation, selective dissolution and/or evaporation.

* * * * *